(12) United States Patent
Li et al.

(10) Patent No.: US 11,164,923 B2
(45) Date of Patent: Nov. 2, 2021

(54) DISPLAY

(71) Applicant: SHENZHEN CHINA STAR OPTOELECTRONICS SEMICONDUCTOR DISPLAY TECHNOLOGY CO., LTD., Guangdong (CN)

(72) Inventors: Xianglong Li, Guangdong (CN); Hong Meng, Guangdong (CN)

(73) Assignee: SHENZHEN CHINA STAR OPTOELECTRONICS SEMICONDUCTOR DISPLAY TECHNOLOGY CO., LTD., Guangdong (CN)

(*) Notice: Subject to any disclaimer, the term of this patent is extended or adjusted under 35 U.S.C. 154(b) by 90 days.

(21) Appl. No.: 16/618,754

(22) PCT Filed: Nov. 19, 2019

(86) PCT No.: PCT/CN2019/119341
§ 371 (c)(1),
(2) Date: Dec. 2, 2019

(87) PCT Pub. No.: WO2020/253091
PCT Pub. Date: Dec. 24, 2020

(65) Prior Publication Data
US 2021/0043703 A1    Feb. 11, 2021

(30) Foreign Application Priority Data
Jun. 20, 2019    (CN) .......................... 201910536654.9

(51) Int. Cl.
*H01L 29/08* (2006.01)
*H01L 27/32* (2006.01)
*H01L 51/00* (2006.01)
*H01L 51/56* (2006.01)

(52) U.S. Cl.
CPC ...... *H01L 27/3246* (2013.01); *H01L 51/0005* (2013.01); *H01L 51/56* (2013.01)

(58) Field of Classification Search
CPC . H01L 27/32; H01L 27/3246; H01L 27/3216; H01L 51/0005; H01L 51/5284
See application file for complete search history.

(56) References Cited

U.S. PATENT DOCUMENTS

| | | | |
|---|---|---|---|
| 2016/0351092 A1* | 12/2016 | Chen | G09G 3/3233 |
| 2017/0194395 A1* | 7/2017 | Hu | H01L 51/0005 |
| 2017/0338292 A1* | 11/2017 | Choi | H01L 27/3216 |
| 2018/0315963 A1 | 11/2018 | Madigan | |
| 2019/0002719 A1* | 1/2019 | Pousthomis | C09D 11/36 |
| 2020/0203384 A1 | 6/2020 | Huo | |

FOREIGN PATENT DOCUMENTS

| | | |
|---|---|---|
| CN | 105206643 A | 12/2015 |
| CN | 105448950 A | 3/2016 |
| CN | 205542786 U | 8/2016 |
| CN | 108598140 A | 9/2018 |
| CN | 108962939 A | 12/2018 |
| CN | 109686768 A | 4/2019 |

\* cited by examiner

Primary Examiner — Phuc T Dang

(57) ABSTRACT

The present invention provides a display including: a pixel definition layer having a plurality of strip-shaped openings arranged in at least two columns or at least two rows parallel to each other; and a plurality of sub-pixels, wherein at least two adjacent sub-pixels are disposed in each of the strip-shaped openings.

14 Claims, 3 Drawing Sheets

DISPLAY

BACKGROUND OF INVENTION

Field of Invention

The present invention relates to a display, and more particularly to a display having a strip-shaped pixel definition layer.

Description of Prior Art

An inkjet printing method can efficiently utilize materials and is suitable for preparing large-area display panels. Referring to FIG. 1, FIG. 1 is a schematic diagram of a pixel design of a conventional panel 100 commonly used, which is a side-by-side (SBS) design, that is, each pixel 110 is made of independent sub-pixels 111 regularly arranged. The sub-pixels 111 are spaced apart from each other by a pixel definition layer 120. In general, inkjet printed pixels have sizes of approximately 200 um*200 um (depending on the screen size and resolution), and the sub-pixel requirements are required even to be smaller, and ink drops of the inkjet printing have diameters of approximately 30 um. For the inkjet printing, printing such pixels requires the printer to have extremely high printing accuracy, movement accuracy, and precise ink drop control. It does not allow misprinting, missing printing, and ink bridging of the ink in adjacent pixels. Otherwise, it will lead to uneven film thickness, and a color mixing problem will occur due to the ink bridging during printing a light-emitting layer. A number of sub-pixels in quadruple full HD resolution is 3940*2160*3, which is above a 10-million level. Even a one-millionth printing abnormal probability will cause a number of defective pixels in the entire panel to exceed a normal specification tolerance (≤3), so the traditional panel SBS pixel design concept is difficult to meet the high-resolution panel preparation requirements.

In order to solve the problem of inaccurate pixel printing when preparing a conventional panel, there is an urgent need to develop a novel pixel design that can improve the success rate of printing, which has a larger opening of the pixel definition layer, thus enlarging a printing area, to solve the problems of the current harsh demands for the ink drop accuracy and the drop control system, and increase the success rate of printing.

SUMMARY OF INVENTION

In view of the above, the present invention provides a display including a novel pixel design, combining partial pixels in a long axis or a short axis direction to form a strip-shaped opening in a pixel definition layer, thereby enlarging a printing area to solve the problems of the current harsh demands for the ink drop accuracy and the drop control system, and increase the success rate of printing.

Accordingly, in accordance with an embodiment of the present invention, the present invention provides a display including a pixel definition layer having a plurality of strip-shaped openings arranged in at least two columns or at least two rows parallel to each other; and a plurality of sub-pixels, wherein at least two adjacent sub-pixels are disposed in each of the strip-shaped openings.

In an embodiment of the invention, the pixel definition layer is a single-layered, a double-layered, or a multilayered structure.

In an embodiment of the invention, the plurality of strip-shaped openings extend in a direction along a short-axis direction of the display.

In an embodiment of the invention, the plurality of strip-shaped openings extend in a direction along a long-axis direction of the display.

In an embodiment of the invention, at least two adjacent sub-pixels disposed in the same strip-shaped opening are sub-pixels adjacent to each other in a same row or sub-pixels adjacent to each other in a same column, and the two adjacent sub-pixels have a same color or different colors. In an embodiment of the invention, the display further includes: a substrate under the pixel definition; a plurality of electrodes located above the substrate, wherein the strip-shaped openings expose the plurality of electrodes.

In an embodiment of the invention, the display further includes: a plurality of thin film transistors disposed between the plurality of electrodes and the substrate.

In an embodiment of the invention, the display further includes a plurality of strip-shaped pixels, wherein one of the plurality of strip pixels is composed of at least two adjacent ones of the plurality of sub-pixels, and the plurality of strip-shaped pixels are arranged in at least two columns parallel to each other.

In an embodiment of the invention, the display further includes a plurality of strip-shaped pixels, wherein one of the plurality of strip-shaped pixels is composed of at least two adjacent ones of the plurality of sub-pixels, and the plurality of strip-shaped pixels are arranged in at least two columns or two rows parallel to each other. In an embodiment of the invention, the pixel definition layer includes an organic material.

In an embodiment of the invention, the organic material includes at least one of: polyimide, acrylic, and phenolic resin.

The invention also provides a method of preparing a display, including:

S10 providing a pixel definition layer, wherein the pixel definition layer has a plurality of strip-shaped openings arranged in at least two columns or at least two rows parallel to each other; and S20 providing a plurality of sub-pixels, wherein at least two adjacent sub-pixels are disposed in each of the strip-shaped openings.

In an embodiment of the invention, in the step S10, the pixel definition layer is opened by etching to form a plurality of strip-shaped openings exposing a plurality of electrodes under the pixel definition layer; and in the step S20, the plurality of sub-pixels are spray-coated into the plurality of strip-shaped openings by an inkjet printing process.

The invention provides a display including a novel pixel design, combining partial pixels in a long axis or a short axis direction to form a strip-shaped opening in a pixel definition layer, thereby enlarging a printing area to solve the problems of the current harsh demands for the ink drop accuracy and the drop control system, and increase the success rate of printing.

BRIEF DESCRIPTION OF DRAWINGS

In order to more clearly illustrate the embodiments or the technical solutions of the existing art, the drawings illustrating the embodiments or the existing art will be briefly described below. Obviously, the drawings in the following description merely illustrate some embodiments of the pres

DETAILED DESCRIPTION OF PREFERRED EMBODIMENTS

Figure 1:
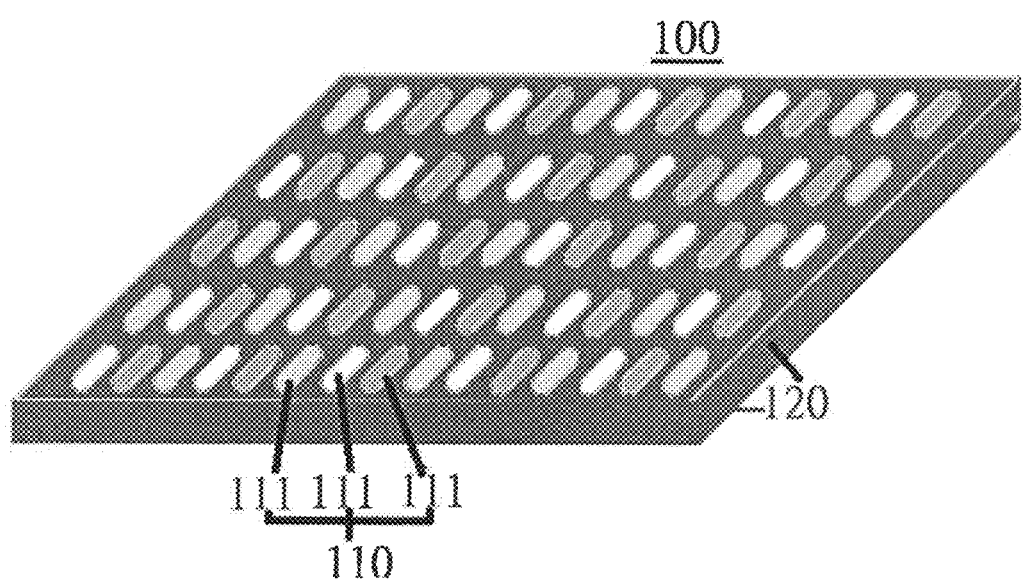
- FIG. 1 is a schematic diagram of a pixel design of a conventional panel that is currently commonly used.

In order to make the above description of the present invention more comprehensible, the preferred embodiments are described below in detail with reference to the accompanying drawings.

The following description of the various embodiments is provided to illustrate the specific embodiments of the invention. Directional terms mentioned in the present invention, such as "vertical", "horizontal", "upper", "bottom", "pre", "post", "left", "right", "inside", "outside", "side", etc., only refer to the direction of the additional drawing. Therefore, the directional terminology used is for the purpose of illustration and understanding of the invention. In the figures, structurally similar elements are denoted by the same reference numerals.

In order to solve the problem of inaccurate pixel printing when preparing a conventional panel, there is an urgent need to develop a novel pixel design that can improve the success rate of printing, which has a larger opening of the pixel definition layer, thus enlarging a printing area, to solve the problems of the current harsh demands for the ink drop accuracy and the drop control system, and increase the success rate of printing.

Figure 2:
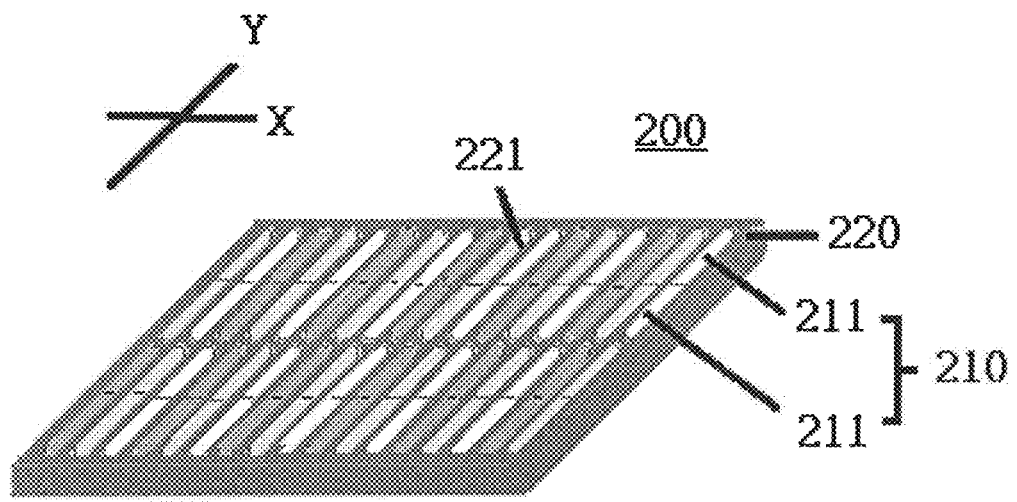
FIG. 2 is a schematic diagram of a pixel design of a display according to an embodiment of the invention.

FIG. 2 is a schematic diagram of a pixel design of a display according to an embodiment of the invention. As shown in FIG. 2, in particular, a display 200 according to an embodiment of the present invention includes: a pixel definition layer 220, wherein the pixel definition layer 220 has a plurality of strip-shaped openings 221 arranged in at least two columns parallel to each other; and a plurality of sub-pixels 211, wherein at least two adjacent sub-pixels 211 are disposed in one of the strip-shaped openings 221. In this embodiment, the plurality of strip-shaped openings 221 extend in a direction along a long axis Y of the display 200.

Still referring to FIG. 2, in this embodiment, the display 200 further includes a plurality of strip-shaped pixels 210, wherein one of the plurality of strip-shaped pixels 210 is composed of at least two adjacent ones of the plurality of sub-pixels 211, and the plurality of strip-shaped pixels 210 are arranged in at least two columns parallel to each other.

As shown in FIG. 2, in an embodiment of the present invention, the at least two adjacent sub-pixels 211 disposed in a same strip-shaped opening 221 are sub-pixels 211 adjacent to each other in a same column, and the two adjacent sub-pixels 211 have a same color.

Figure 3:
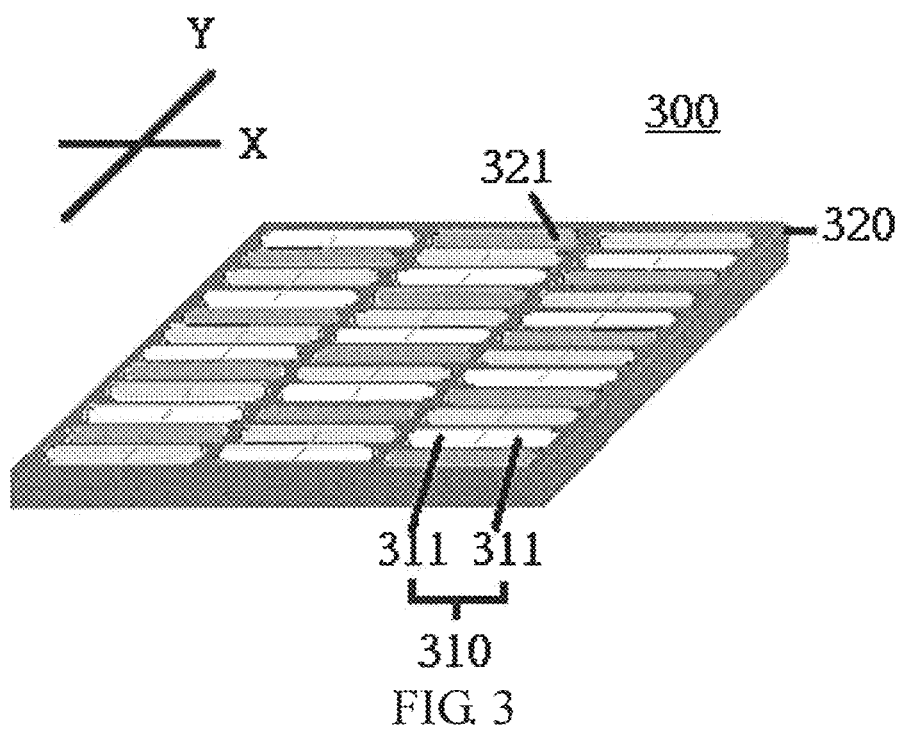
FIG. 3 is a schematic diagram of a pixel design of a display according to another embodiment of the present invention.

FIG. 3 is a schematic diagram of a pixel design of a display according to another embodiment of the present invention. As shown in FIG. 3, in particular, a display 300 according to an embodiment of the present invention includes a pixel definition layer 320 having a plurality of strip-shaped openings 321 arranged in at least two rows parallel to each other; and a plurality of sub-pixels 311, wherein at least two adjacent sub-pixels 311 are disposed in one of the strip-shaped openings 321. In this embodiment, the plurality of strip-shaped openings 321 extend in a direction of a short axis X of the display 300.

Still referring to FIG. 3, in this embodiment, each of the plurality of strip-shaped openings 321 corresponds to one of the plurality of strip-shaped pixels 310, wherein one of the plurality of strip-shaped pixels 310 is composed of at least two adjacent ones of the sub-pixels 311, and the plurality of strip-shaped pixels 310 are arranged in at least two rows parallel to each other.

As shown in FIG. 3, in an embodiment of the present invention, at least two adjacent sub-pixels 311 disposed in a same strip-shaped opening 321 are sub-pixels 311 adjacent to each other arranged in a same row, and the two adjacent sub-pixels 311 have a same color.

Although in the above embodiments, only taking the case where the colors of the two adjacent sub-pixels disposed in the same strip-shaped opening are the same as examples, in other embodiments of the present invention, more than two sub-pixels adjacent to each other may be arranged in a same strip-shaped opening; and colors of the sub-pixels adjacent to each other may be the same or different from each other, and are not limited to illustrations of the drawings.

Figure 4:
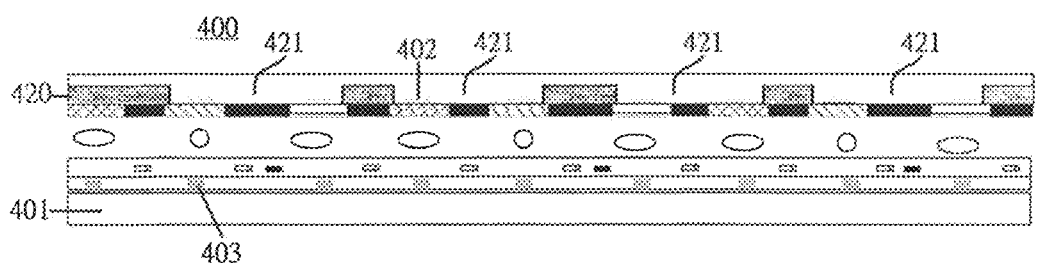
FIG. 4 is a schematic structural view of a display according to an embodiment of the invention.

Referring to FIG. 4, FIG. 4 is a schematic structural diagram of a display according to an embodiment of the invention. As shown in FIG. 4, a display 400 according to an embodiment of the present invention includes a substrate 401, a plurality of electrodes 402 disposed on the substrate 401, and a pixel definition layer 420 located above the plurality of electrodes 402. The pixel definition layer 420 has a plurality of strip-shaped openings 421, wherein the plurality of strip-shaped openings 421 expose the plurality of electrodes 402. The pixel definition layer 420 may have a plurality of strip-shaped openings extending in a direction along a long axis of the display as shown in FIG. 2, or a plurality of strip-shaped openings extending in a direction along a short axis of the display as shown in FIG. 3.

Still referring to FIG. 4, in an embodiment of the invention, the display further includes: a plurality of thin film transistors 403 disposed between the plurality of electrodes 402 and the substrate 401.

Although the pixel definition layer in the above embodiments are exemplified by only a single-layered structure, in other embodiments of the present invention, the pixel definition layer may specifically be a single-layered, a double-layered, or a multilayered structure.

In an embodiment of the invention, the substrate may be a rigid substrate (such as a glass substrate) or a flexible substrate (such as a polyimide (PI) substrate), or may be a substrate made of other materials, and is not limited to the above examples.

In an embodiment of the invention, the pixel definition layer includes an organic material.

In an embodiment of the invention, the organic material includes at least one of: polyimide, acrylic, and phenolic resin.

Referring to FIG. 3, the present invention also provides a method of preparing a display 300, including:

S10 providing a pixel definition layer 320, wherein the pixel definition layer 320 has a plurality of strip-shaped openings 321 arranged in at least two columns parallel to each other or at least two rows parallel to each other; and S20 providing a plurality of sub-pixels 311, wherein at least two adjacent sub-pixels 311 are disposed in each of the strip-shaped openings 321.

Referring to FIG. 3, according to an embodiment of the invention, in the step S10, the pixel definition layer 320 is opened by etching to form a plurality of strip-shaped openings 321 exposing a plurality of electrodes 402 under the pixel definition layer 320 as shown in FIG. 4.

Referring to FIG. 3, according to an embodiment of the invention, in the step S20, the plurality of sub-pixels 311 are spray-coated into the plurality of strip-shaped openings 321 by an inkjet printing process.

Accordingly, the present invention provides a display including a novel pixel design, combining partial pixels in a long axis or a short axis direction to form a strip-shaped opening in a pixel definition layer, thereby enlarging a printing area to solve the problems of the current harsh demands for the ink drop accuracy and the drop control system, and increase the success rate of printing.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A display, comprising:
   a pixel definition layer having a plurality of strip-shaped openings arranged in at least two columns or at least two rows parallel to each other; and
   a plurality of sub-pixels, wherein at least two adjacent sub-pixels are disposed in each of the strip-shaped openings, wherein the plurality of strip-shaped openings extend in a direction along a short-axis direction or a long-axis direction of the display, and the pixel definition layer is a single-layered, a double-layered, or a multilayered structure, wherein the strip-shaped openings and the pixel definition layer are arranged in a staggered manner.

2. The display of claim 1, further comprising a plurality of strip-shaped pixels, wherein one of the plurality of strip-shaped pixels is composed of at least two adjacent ones of the plurality of sub-pixels, and the plurality of strip-shaped pixels are arranged in at least two columns or two rows parallel to each other.

3. The display according to claim 1, wherein at least two adjacent sub-pixels disposed in a same strip-shaped opening are sub-pixels adjacent to each other in a same column or sub-pixels adjacent to each other in a same row.

4. The display of claim 1, further comprising:
   a substrate; and
   a plurality of electrodes located above the substrate,
   wherein the pixel definition layer is disposed on a surface of the plurality of electrodes facing away from the substrate, wherein the plurality of strip-shaped openings of the pixel definition layer expose the plurality of electrodes.

5. A display, comprising:
   a pixel definition layer having a plurality of strip-shaped openings arranged in at least two columns or at least two rows parallel to each other; and
   a plurality of sub-pixels, wherein at least two adjacent sub-pixels are disposed in each of the strip-shaped openings, wherein the strip-shaped openings and the pixel definition layer are arranged in a staggered manner.

6. The display of claim 5, wherein the pixel definition layer is a single-layered, a double-layered, or a multilayered structure.

7. The display of claim 5, wherein the plurality of strip-shaped openings extend in a direction along a short-axis direction of the display.

8. The display of claim 5, wherein the plurality of strip-shaped openings extend in a direction along a long-axis direction of the display.

9. The display of claim 5, further comprising a plurality of strip-shaped pixels, wherein one of the plurality of strip-shaped pixels is composed of at least two adjacent ones of the plurality of sub-pixels, and the plurality of strip-shaped pixels are arranged in at least two columns parallel to each other.

10. The display of claim 5, further comprising a plurality of strip-shaped pixels, wherein one of the plurality of strip-shaped pixels is composed of at least two adjacent ones of the plurality of sub-pixels, and the plurality of strip-shaped pixels are arranged in at least two rows parallel to each other.

11. The display according to claim 5, wherein at least two adjacent sub-pixels disposed in a same strip-shaped opening are sub-pixels adjacent to each other in a same column or sub-pixels adjacent to each other in a same row.

12. The display of claim 5, further comprising:
    a substrate; and
    a plurality of electrodes located above the substrate,
    wherein the pixel definition layer is disposed on a surface of the plurality of electrodes facing away from the substrate, wherein the plurality of strip-shaped openings of the pixel definition layer expose the plurality of electrodes.

13. A method of preparing a display, comprising:
    providing a pixel definition layer, wherein the pixel definition layer has a plurality of strip-shaped openings arranged in at least two columns or at least two rows parallel to each other; and
    providing a plurality of sub-pixels, wherein at least two adjacent sub-pixels are disposed in each of the strip-shaped openings, wherein the strip-shaped openings and the pixel definition layer are arranged in a staggered manner.

14. The method according to claim 13, wherein during said providing a pixel definition layer, the pixel definition layer is opened by etching to form a plurality of strip-shaped openings exposing a plurality of electrodes under the pixel definition layer; and during said providing a plurality of sub-pixels, the plurality of sub-pixels are spray-coated into the plurality of strip-shaped openings by an inkjet printing process.

* * * * *